United States Patent [19]

Daum et al.

[11] Patent Number: 5,166,605
[45] Date of Patent: Nov. 24, 1992

[54] CONTROLLED IMPEDANCE TEST FIXTURE FOR PLANAR ELECTRONIC DEVICE

[75] Inventors: Wolfgang Daum, Schenectady; Jerome L. Garrett, Latham; John L. Thomas, Jr., Scotia, all of N.Y.

[73] Assignee: General Electric Company, Schenectady, N.Y.

[21] Appl. No.: 739,363

[22] Filed: Aug. 2, 1991

[51] Int. Cl.⁵ .............................................. G01R 31/02
[52] U.S. Cl. ............................... 324/158 F; 324/158 P
[58] Field of Search ............... 324/158 F, 158 P, 72.5, 324/73.1

[56] References Cited

U.S. PATENT DOCUMENTS

| | | | |
|---|---|---|---|
| 4,567,432 | 1/1986 | Buol et al. | 324/158 F |
| 4,783,695 | 11/1988 | Eichelberger et al. | 357/65 |
| 4,816,422 | 3/1989 | Yerman et al. | 437/51 |
| 4,829,014 | 5/1989 | Yerman | 437/8 |
| 4,878,991 | 11/1989 | Eichelberger et al. | 156/630 |
| 4,884,122 | 11/1989 | Eichelberger et al. | 357/71 |
| 5,038,100 | 8/1991 | Kushner et al. | 324/158 F |
| 5,066,907 | 11/1991 | Tarzwell et al. | 324/158 F |

FOREIGN PATENT DOCUMENTS

| | | | |
|---|---|---|---|
| 59-138345 | 8/1984 | Japan | 324/158 P |
| 2177253 | 6/1985 | United Kingdom | 324/158 P |

*Primary Examiner*—Ernest F. Karlsen
*Attorney, Agent, or Firm*—Marvin Snyder

[57] ABSTRACT

A coplanar test fixture facilitates fixturing and high speed automatic testing of planar electronic devices, such as high density interconnect (HDI) modules, having a plurality of contact pads on a major surface thereof. The fixture includes, for interfacing to automatic test equipment (ATE), an ATE load board, and a customized printed circuit load card situated coplanarly within an aperture in the load board. The load card has an aperture for receiving, coplanarly, a device under test. Metal-on-elastomer (MOE) conductor assemblies make electrical contact between the load board and outer contacts on the load card, and between inner contacts on the load card and contacts of the device under test. Clamping devices secure the conductor assemblies to the load board, the load card and the electronic device under test, and secure the load board, the load card and the electronic device to each other. The elastomeric conductor assemblies facilitate mechanical (vibrational) exercising of the electronic device during electrical testing.

21 Claims, 4 Drawing Sheets

CONTROLLED IMPEDANCE TEST FIXTURE FOR PLANAR ELECTRONIC DEVICE

BACKGROUND OF THE INVENTION

The present invention relates generally to test fixtures and, more particularly, to test fixtures suitable for high speed automatic testing of planar electronic devices, including electronic assemblies in general and high density interconnect (HDI) modules having a plurality of contact pads.

For testing planar electronic devices such as HDI modules of the type described in Eichelberger et al. U.S. Pat. No. 4,783,695 issued Nov. 8, 1988 and assigned to the instant assignee, it is usual to employ high speed automatic test equipment (ATE) suitably connected to various inputs and outputs of a device under test (DUT). The automatic test equipment exercises the device under test by rapidly applying a series of test vectors to the device inputs, and checking for expected output signals. The automatic test equipment runs at high speed to minimize the time required for testing. Perhaps more significantly, for a complete test it is necessary to exercise the device at its intended operating frequency, which may be 50 MHz, or higher. In the case of a planar electronic device which is an HDI module, testing is performed prior to final packaging of the module. This is particularly significant in increasing yield, because an HDI module may readily be repaired in the event it fails a test.

A previous approach for testing HDI modules in particular involves using a fixture including a probe card holding spring-loaded "pogo" pins which make contact to test pads on the HDI modules. The "pogo" pin probe card in turn is connected to the automatic test equipment via a wire harness including individual wires or cables with or without standard interface connectors. Typically, the automatic test equipment employs a general purpose ATE load board, which is a carefully designed, multi-layer printed circuit board having well-controlled impedance characteristics. The load board mates directly with the automatic test equipment, and provides connection points for connection to a device under test through the cables.

With this previous approach, the long cable length adds too much loading for high speed testing. Also if the interconnect is not fully defined, appropriate connections to allow high speed testing cannot be made. Moreover, alignment of the test fixture to the HDI module is not easily accomplished because of the small (10 mil × 10 mil) HDI pad size, and the large number of contact pads (as many as 276) around the periphery of a two inch by two inch module.

Moreover, in some circumstances, the spring-loaded "pogo" pin contacts can physically damage the device contact pads during testing.

SUMMARY OF THE INVENTION

Accordingly, it is an object of the invention to provide an improved test fixture for planar electronic devices such as HDI modules.

It is another object of the invention to provide a test fixture for HDI modules which has controlled impedance characteristics to facilitate high speed, high frequency testing.

It is yet another object of the invention to provide a test fixture which minimizes the length of conductors between the ATE load board and the device under test.

It is yet another object of the invention to provide a test fixture which facilitates rapid connection to a device under test, notwithstanding a large number of small, closely-spaced contact pads on the device under test.

It is yet another object of the invention to provide a test fixture which facilitates thermal and mechanical testing, such as vibration testing, of a device under test while the device is connected to the automatic test equipment.

Briefly stated, and in accordance with an overall aspect of the invention, the foregoing and other objects are satisfied by a coplanar test fixturing arrangement, with the shortest possible electrical conductor lengths facilitating controlled impedance on the entire test fixture. The wire harness, probe card and associated equipment of the prior art are all replaced by a specialized load card with metal-on-elastomer connectors and appropriate clamping devices.

More particularly, a controlled impedance test fixture is provided for testing a generally planar electronic device, such as an HDI module, having a major surface and a plurality of contact pads on the major surface. The test fixture includes a generally planar load board for interfacing to test equipment, a generally planar printed circuit load card, and elastomeric conductor assemblies for connecting the load board to the load card and for connecting the load card to the device under test.

The load board is a general purpose ATE load board, available as an element of commercially available automatic test equipment. The load board is generally planar, and has a central load board aperture larger than the device under test. A plurality of load board contacts surround the load board aperture. These load board contacts may be spaced from the aperture, in which case the load board additionally includes an electrical ground ring between the load board contacts and the load board aperture. Typically, the load board is double sided, with load board contacts and ground rings on both sides.

In accordance with the invention, a generally planar printed circuit board load card having an outer boundary sized to fit within the load board aperture in coplanar relationship with the load board is also provided, customized for the particular device under test. The load card in turn includes a load card aperture sized and configured to match the device under test such that the device fits within, and in coplanar relationship with, the load card aperture. A plurality of load card outer contacts are located generally along the outer boundary of the load card, corresponding to the load board contacts. Additionally, a plurality of load card inner contacts surround the load card aperture and correspond in pitch and number with the contact pads on the device. On the load card, electrical conductors extend between selected ones of the load card outer contacts and the load card inner contacts.

In addition to the load board and the load card, the test fixture includes at least one load-board-to-load-card conductor assembly for connecting selected load board contacts to selected load card outer contacts, and at least one load-card-to-device conductor assembly for similarly connecting selected load card inner contacts to corresponding electronic device contact pads.

A first clamping device is provided for securing the load-board-to-load-card conductor assembly to the load board and to the load card to maintain electrical contact with the load board contacts and with the load card outer contacts, and to mechanically secure the load card with reference to the load board. In one embodiment, the first clamping device includes upper and lower annular rings disposed on opposite sides of both the load board and load card, with the load-board-to-load-card conductor assembly disposed between one of the first clamping device annular rings and surfaces of both the load board and load card.

A second clamping device is provided for securing the load-card-to-device conductor assembly to the load card and to the electronic device to maintain contact with the load card inner contacts and with the electronic device contact pads, and to mechanically secure the electronic device with reference to the load card. Preferably, the second clamping device also includes upper and lower annular rings disposed on opposite sides of both the load card and electronic device, with the load-card-to-device conductor assembly disposed between one of the second clamping device annular rings and each of a surface of the load card and the major surface of the device.

Typically, the load card thickness is selected to at least approximate the thickness of the load board, but this thickness differs from the thickness of the electronic device under test. To accommodate these different thicknesses, the second clamping device lower annular ring includes a step, such that the major surface of the electronic device under test is maintained coplanar with a surface of the load card.

The second clamping device is mechanically aligned with reference to the load card, and includes alignment markers for visual alignment with alignment marks on the electronic device. Alignment of the load card with the load board is done one time only, while the alignment markers on the second clamping device facilitate rapid visual alignment of electronic devices under test to the load card as each subsequent electronic device being tested is fixtured to the load card.

Where the load-card-to-load-board conductor assembly crosses the electrical ground ring on the load board around the aperture therein, an insulative strip, such as ordinary tape, is placed between the electrical ground ring and the load-card-to-load-board conductor assembly.

It will be appreciated that the metal-on-elastomer conductor assemblies allow mechanical excitation, such as high frequency vibration, to be applied to the device under test, accommodating the relative motion while maintaining electrical contact. In addition, other special test requirements can be introduced, such as thermal excitation and radiation.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DETAILED DESCRIPTION

Figure 1:
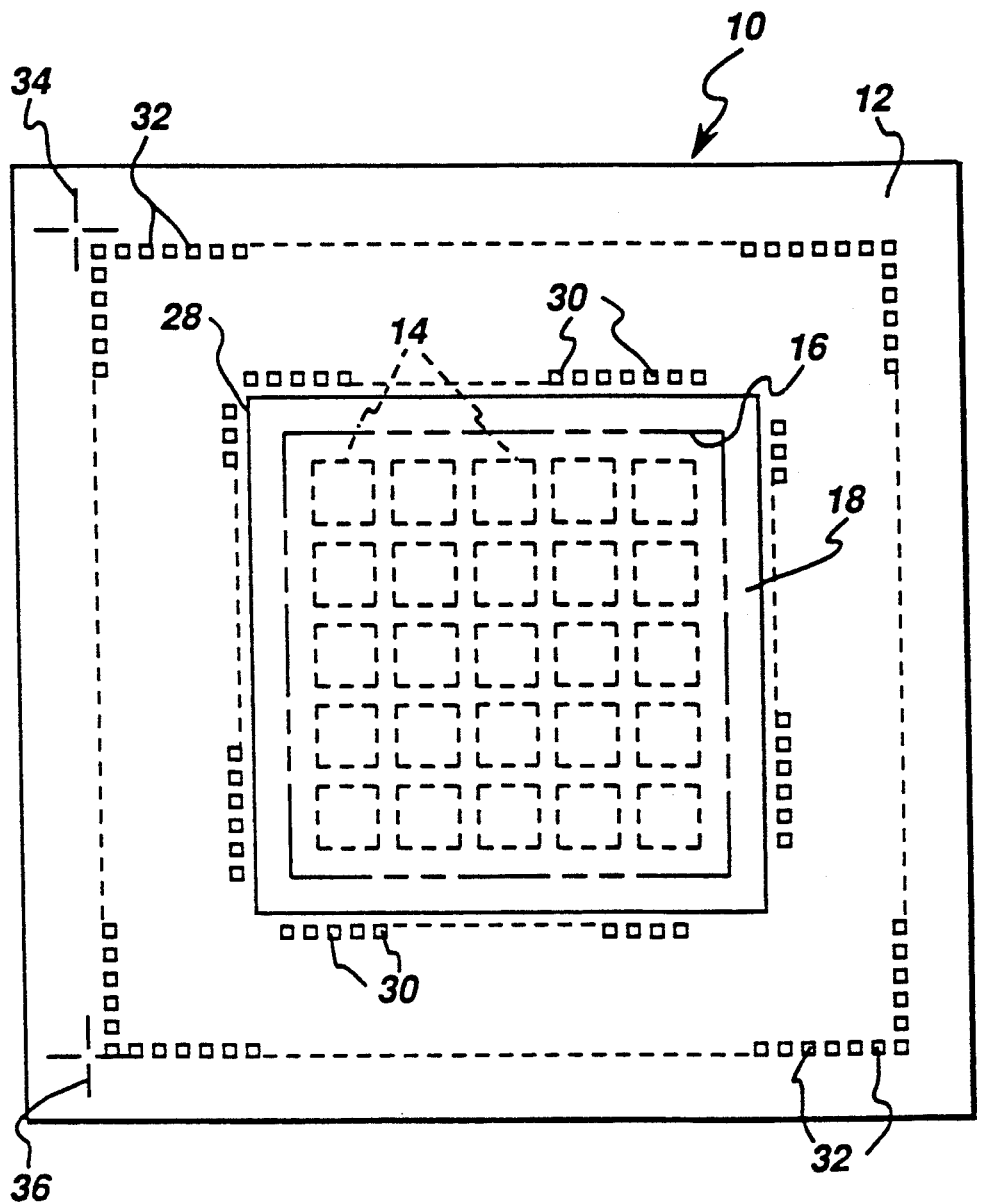
FIG. 1 is a partially schematic plan view of an exemplary electronic device to be tested, in the form of a high density interconnect (HDI) module.

FIG. 1 depicts, in plan view, an HDI module 10 representative of a generally planar electronic device which may be tested by employing the test fixture of the invention. It will be appreciated, however, that employment of the test fixture of the invention is not so limited, and that a variety of other electronic devices, assemblies, modules and the like may be tested.

Briefly, an HDI structure has been developed, one form of which is described in the aforementioned Eichelberger et al. U.S. Pat. No. 4,783,695, which is hereby incorporated by reference. The HDI structure offers many advantages in the compact assembly of digital and other electronic systems. For example, an electronic system which incorporates between thirty and fifty integrated circuit (IC) chips and other components can be fully assembled and interconnected on a single substrate which is two inches square and 0.050 inch thick.

Perhaps as significant as the compactness of this HDI structure is the fact that the structure can be disassembled for repair or replacement of a faulty component, and then reassembled, without significant risk of damage to the good components or chips in the system. Techniques for disassembly and reassembly are disclosed, for example, in Eichelberger et al U.S. Pat. No. 4,878,991, issued Nov. 7, 1989, and U.S. Pat. No. 4,884,122, issued Nov. 28, 1989, both of which are assigned to the instant assignee. This reworkability or repairability is a substantial advance over prior connection systems. The test fixture of the present invention facilitates effective testing of the HDI modules prior to final packaging, thus providing an opportunity for repair. HDI module 10 of FIG. 1 is shown in its condition prior to final packaging. It will be appreciated that, by testing HDI modules prior to final packaging (and repairing if necessary), ultimate yield approaches 100%.

Figure 2:
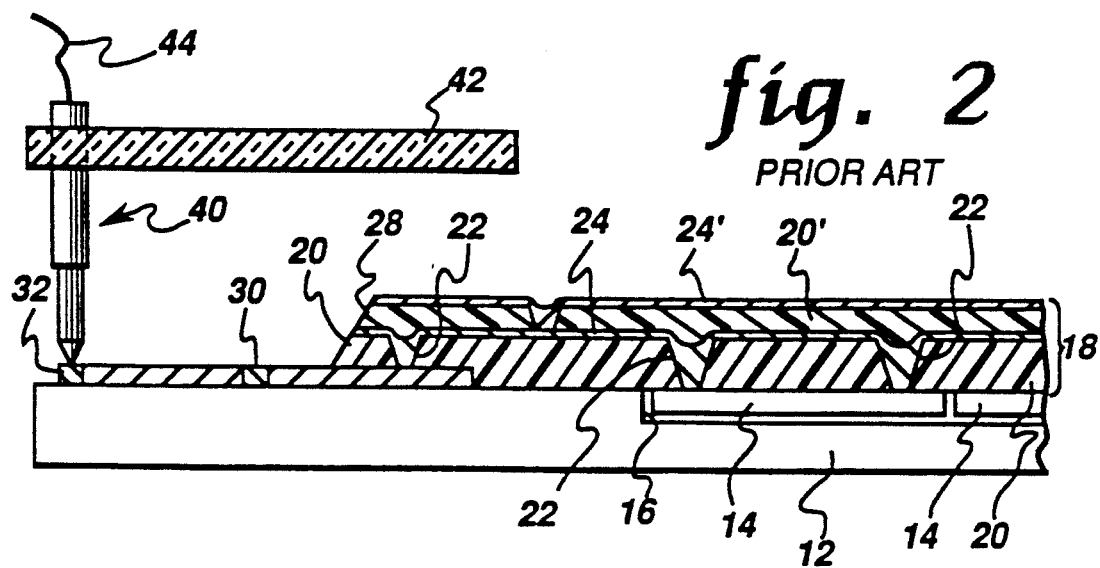
FIG. 2 illustrates a cross section of the FIG. 1 device, together with a portion of the test fixture of the prior art employing a spring-loaded "pogo" pin to make electrical contact with test pads on the device under test.

As shown also in FIG. 2, the high density interconnect structure is built up on a ceramic substrate 12, such as alumina. Substrate 12 may for example be 100 mils thick, and of appropriate size and strength for the overall system. A typical size is two inches square. A plurality of individual integrated circuit chips 14 are placed either within one large cavity 16 or within individual cavities (not shown) having appropriate depths at the intended locations of the various chips 14. Cavity 16 may be formed by starting with a bare substrate 12 having uniform thickness in the desired size. Laser milling is used to form the cavities or cavity 16 in which the various chips 14 and other components are subsequently positioned.

The bottom of cavity 16 is provided with a thermoplastic adhesive layer (not shown), preferably a polyetherimide resin available under the trademark ULTEM ® from the General Electric Company. The various chips and components are then placed in their desired locations within cavity 16, and the entire structure is heated to the softening point of the polyetherimide (in the approximate range of 217° C. to 235° C. depending on the formulation used), and then cooled to thermoplastically bond the individual IC chips 14 to cavity 16.

At this juncture, the upper surfaces of chips 14 and substrate 12 are disposed in substantially a common plane. An HDI overcoat 18 is then built up. First, a polyimide film 20 (FIG. 2), such as KAPTON ® polyetherimide available from E. I. du Pont de Nemours & Company, which is about 0.0005 to 0.003 inch (12.5 to 75 microns) thick, is pre-treated to promote adhesion, and is coated on one side with a polyetherimide resin or another thermoplastic (not shown) and laminated across the top of chips 14 and of the substrate 12. Thereafter, via holes 22 are laser drilled in the KAPTON ® polyetherimide 20 and ULTEM ® layers in alignment with contact pads on the chips 14 to which it is desired to make contact.

Build up of the HDI overcoat 18 continues by depositing a patterned metallization layer 24 over the polyimide layer 20, extending into via holes 22 to make electrical contact with contact pads on chips 14. Additional dielectric and metallization layers may be provided, as required, in order to provide all of the desired electrical connections among chips 14, such as representative polyimide dielectric layer 20' and representative metallization layer 24'.

HDI overcoat 18 terminates at an edge 28 just inside a row of device contact pads 30 to which connections will be made, such as by ultrasonic wire bonding, when device 10 is finally assembled into a package (not shown) following successful testing.

Typically, but not necessarily, for test purposes a series of peripheral outer pads 32 are provided and directly connected through conductors (not shown) to contact pads 30. Following device testing, HDI substrate 12 is sawed at a point intermediate contact pads 30 and test pads 32, leaving contact pads 30 near the final outer periphery .

Also apparent in FIG. 1 are two alignment marks 34 and 36, the positions of which are referenced to test pads 32 to aid in alignment with test fixtures.

FIG. 2 also represents the connection of a single "pogo" pin spring-loaded contact assembly 40 to one of test pads 32. A multiplicity of such spring-loaded "pogo" pins 40 are mounted to a plexiglass holder 42, and connected by individual leads 44 to the automatic test equipment. "Pogo" pin 40, holder 42 and lead 44 are all elements of the previously-known test fixture, not otherwise shown. Typical "pogo" pins are available from Cerprobe, Tempe, Ariz., which terms them IDI probes.

The alignment procedure when employing the previously-known test fixture of FIG. 2 involves centering the various test pads 32 to individual "pogo" pins 40 by visual inspection through plexiglass holder 42. It will be appreciated that, due to a variety of factors such as misalignment or skewing of the "pogo" pins, the multiplicity thereof, and the small size (e.g. 10 mils) of the test pads 32, this can be a difficult and time consuming procedure. Moreover, as discussed hereinabove, the fixturing arrangement represented in FIG. 2 has an ill-defined impedance that makes high speed testing difficult, and is not readily amenable to high speed testing of device 10 prior to final packaging.

Figure 3:
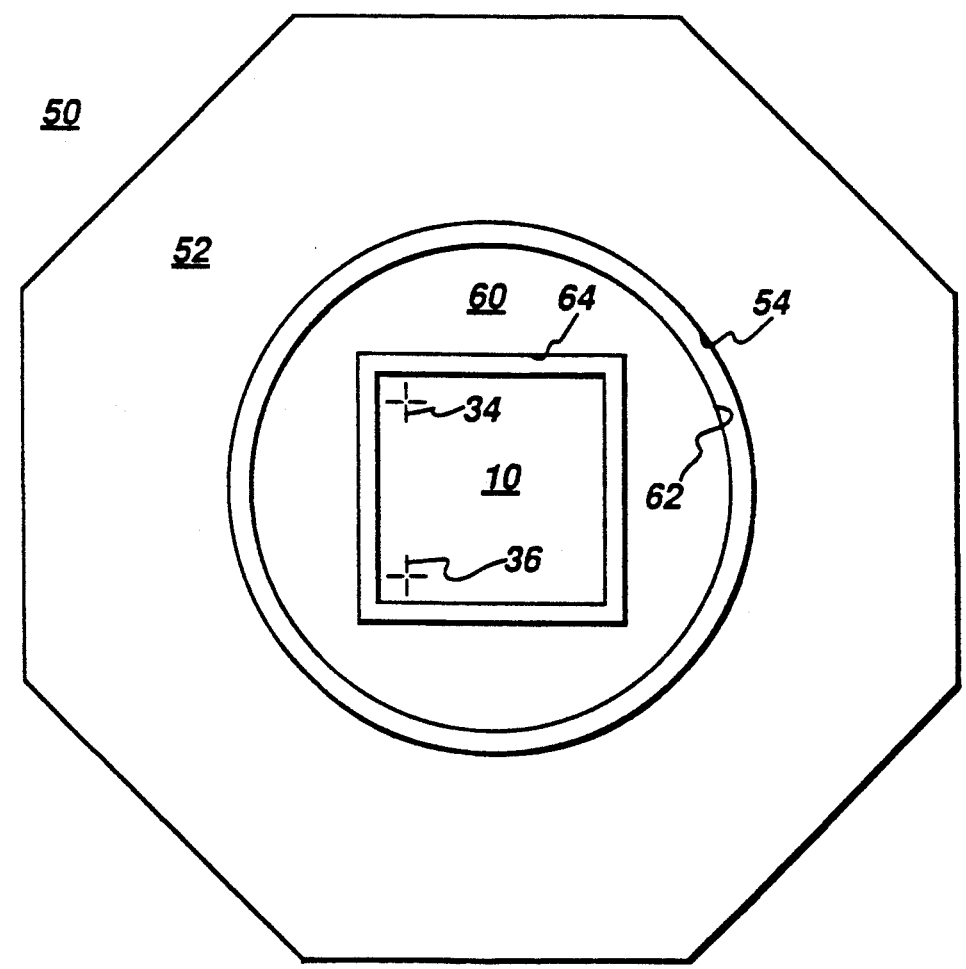
FIG. 3 is a schematic plan view of a portion of the test fixture of the invention, showing the load board, the load card, and the device under test, but omitting the conductor assemblies and clamping devices.

FIG. 3 is a highly diagramatic plan view of device 10 of FIG. 1 situated within elements of a test fixture 50, in accordance with the invention. In FIG. 3, the structure of device 10 as shown in FIG. 1 is omitted for clarity of illustration, except for alignment marks 34 and 36. The coplanar test fixturing aspect of the invention is evident in FIG. 3.

In overview, test fixture 50 includes a general purpose ATE load board 52 for interfacing to automatic test equipment. Load board 52 is a standard device and may comprise an LT1000 GEMST blank DUT board manufactured by Tektronix, Inc. as part of its very high speed integrated circuit (VHSIC) test equipment. Load board 52 includes connections (not shown) for interfacing to the remainder of the automatic test equipment (not shown).

Figure 4:
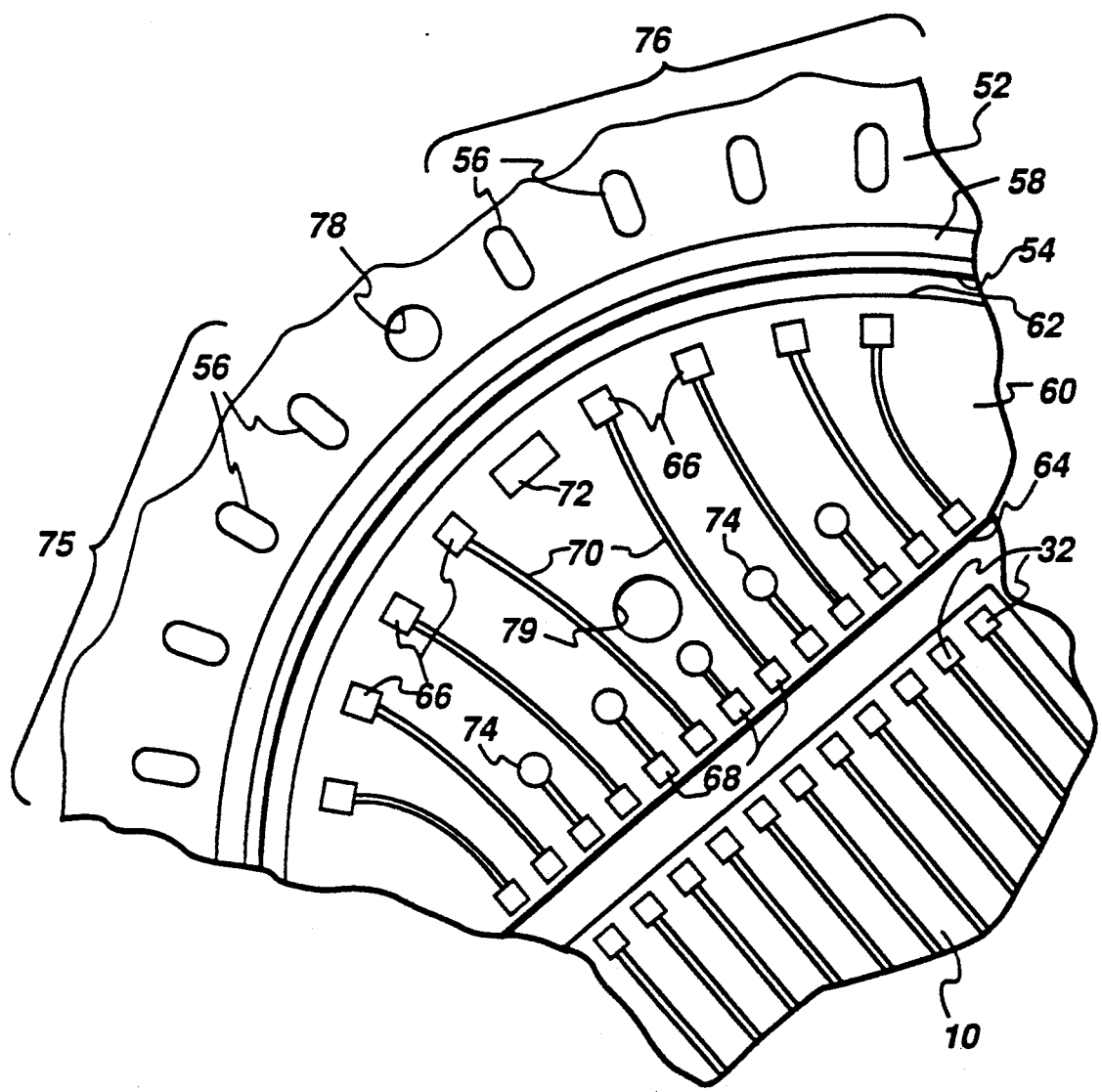
FIG. 4 is an enlarged plan view depicting a portion of the FIG. 3 test fixture.

As shown in enlarged FIG. 4, in addition to FIG. 3, load board 52 has a load board aperture 54 larger than device 10, and a plurality of load board contacts 56 surround load board aperture 54. Load board contacts 56 are spaced from aperture 54. Interposed therebetween is an electrical ground ring 58. As noted above, a commercially available load board is a carefully-designed, multi-layer board, having well controlled impedance characteristics. In addition, such load boards may include both active and passive termination networks, as are appropriate for the particular test equipment.

Test fixture 50 also includes a generally planar printed circuit load card 60 having an outer boundary 62 sized to fit coplanarly within load board aperture 54. Load card 60 is customized for the particular electronic device 10, and may be manufactured to employ a variety of technologies tailored to special test requirements of device 10, such as thermal excitation, mechanical excitation, radiation, and the like.

Load card 60 includes a load card aperture 64 sized and configured to match device 10 such that device 10 fits within load card aperture 54 in coplanar relationship therewith. Located generally along outer boundary 62 are a plurality of load card outer contacts 66 corresponding to load board contacts 56. In addition, a plurality of load card inner contacts 68 surround load card aperture 64 and correspond in pitch and in number with contact pads 32 on device 10 .

Extending between selected ones of load card outer contacts 66 and load card inner contacts 68 are load card electrical conductors 70, which are configured to provide a particular design impedance. Load card conductors 70 are also configured to smoothly transition from a ring of substantially evenly spaced load card outer contacts 66 to four straight rows of load card inner contacts 68, which correspond to the device contact pads 32 (FIGS. 1 and 4). In addition, customized load card 60 may include other components, such as active and passive termination networks (not shown), to maintain controlled impedance characteristics, as well as bypass capacitors (not shown).

Also included on load card 60 is a representative ground contact 72 electrically connected to selected ones of inner contacts 68 through suitable low-impedance ground conductors (not shown).

As will be apparent from the description hereinbelow, particularly with reference to FIG. 5, load board contacts 56 and load card outer contacts 66 are provided on both sides of load board 52 and load card 60 respectively, while, in the illustrated embodiment, load card inner contacts 68 and device contacts 32 are visible on only one side. (Corresponding contacts on the lower side are designated by primed reference numbers.) Thus, selected ones of load card inner contacts 68 are connected to load card outer contacts 66 (FIG. 5) through vias 74 (FIG. 4).

As shown in FIG. 4, load board contacts 56 are conveniently grouped into sections, such as sections 75 and 76, with spaces between sections 75 and 76. The spaces preferably include apertures for mounting purposes, such as representative aperture 78, between sections 75 and 76. The load card outer contacts 66 are grouped into corresponding sections, with ground contacts such as the representative ground contact 72 positioned between sections. Load card 60 similarly includes a mounting aperture 79.

Figure 5:
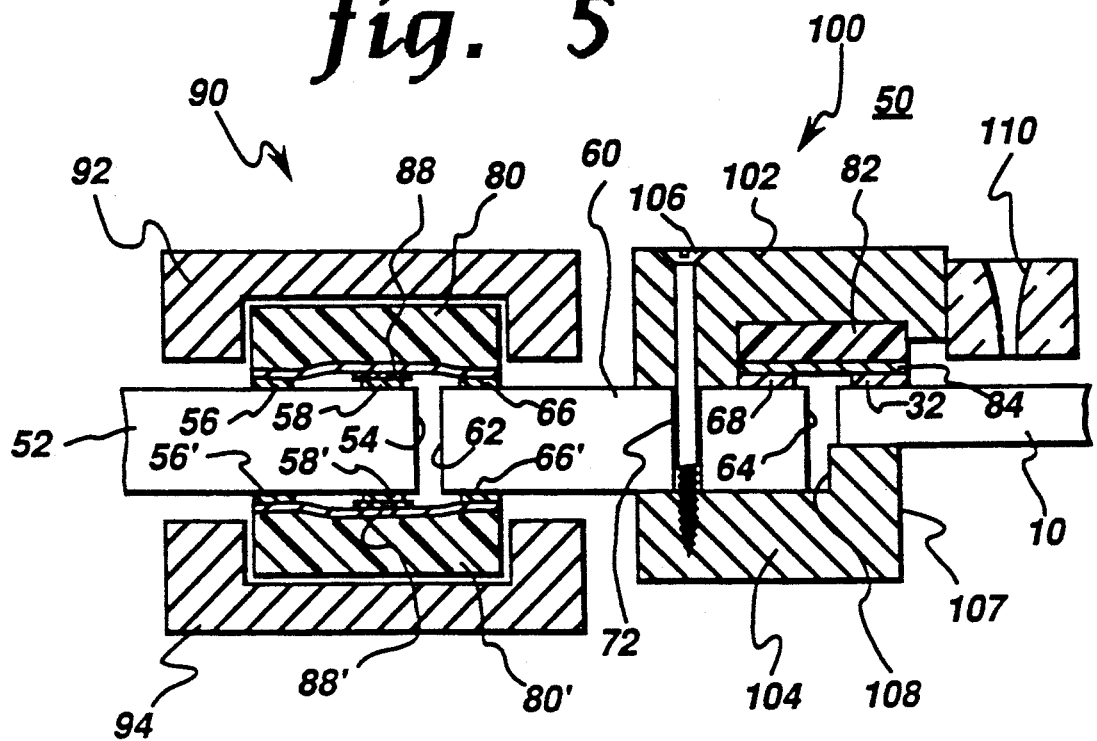
FIG. 5 is a cross-sectional view of a portion of the FIG. 4 test fixture.
Figure 6:
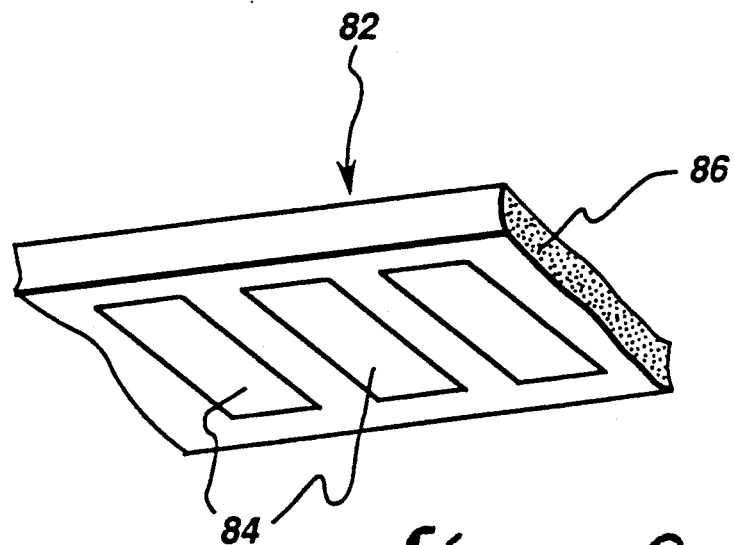
FIG. 6 is three-dimensional view of a metal-on-elastomer conductor assembly, viewed from the underside.

With reference also to FIGS. 5 and 6, electrical connection between load board 52 and load card 60, and between load card 60 and electronic device 10, is shown made by load-board-to-load-card conductor assemblies 80 and 80' and a load-card-to-device conductor assembly 82, respectively. Conductor assemblies 80, 80' and 82 are preferably metal-on-elastomer (MOE) connectors, such as are available from Elastomeric Technologies, Inc., 2940 Turnpike Drive, Hatboro, Pa. 19040.

As shown in FIG. 6, a representative metal-on-elastomer conductor assembly 82 comprises a series of metal conductors 84 attached to an elastomeric backing 86. Conductors 84 are preferably of gold, but other materials, such as silver or graphite, may be employed instead of gold.

Load-board-to-load-card conductor assemblies 80 and 80' connect selected load board contacts 56 and 56' to selected load card outer contacts 66 and 66'. Preferably, multiple metal-on-elastomer load-board-to-load-card conductor assembly 80 and 80' sections are provided, on the tops and bottoms of the assemblies. By grouping conductor assemblies 80 and 80' into sections corresponding to sections 75 and 76 shown in FIG. 4, with some space between individual sections, space between the sections can be employed to secure necessary clamping, for example employing aperture 78. In addition, load-card-to-load-board conductor assembly 80 includes a conductor to provide electrical continuity between ground ring 58 and ground pad 72.

In order to avoid an electrical short circuit where metal-on-elastomer load-board-to-load-card conductor assemblies 80 and 80' cross ground rings 58 and 58', suitable insulative strips 88 and 88' are provided. Insulative strips 88 and 88' may comprise insulating tape, adhered either to load board 52 so as to cover ground rings 58 and 58', or to metal-on-elastomer conductor assemblies 80 and 80'.

For securing load-board-to-load-card conductor assemblies 80 and 80' to load board 52 and to load card 60 to maintain electrical contact with load board contacts 56 and load card outer contacts 66, and to mechanically secure load card 60 with reference to load board 52, a first clamping device generally designated 90 is provided. In particular, clamping device 90 includes upper and lower annular rings 92 and 94 disposed on opposite sides of load board 52 and of load card 60, with load-board-to-load-card conductor assemblies 80 and 80' compressed between annular rings 92 and 94 and surfaces of load board 52 and of load card 60. A suitable attachment (not shown) forces upper and lower sections 92 and 94, respectively, towards each other, and this attachment may conveniently pass through aperture 78 (FIG. 4). Sufficient clamping pressure is applied to ensure reliable electrical contact via MOE conductor assemblies 80 and 80'.

It will be appreciated that alignment of customized load card 60 within the general purpose ATE load board 52 need be done once only during setup for a particular type of electronic device 10 to be tested. Typically, no additional mechanical support is necessary between ATE load board 52 and load card 60, resulting in relatively easy fixturing, and mechanical flexibility afforded by the elastomer of metal-on-elastomer conductor assemblies 80 and 80'. Load-card-to-device conductor assembly 82 similarly connects load card inner contacts 68 to corresponding device contact pads 32. Preferably, a plurality of metal-on-elastomer load-card-to-device conductor assemblies 82 are provided, organized into convenient sections.

A second clamping device, generally designated 100, is provided for securing load-card-to-device conductor assembly 82 to load card 60 and to electronic device 10 to maintain contact with load card inner contacts 68 and with electronic device contact pads 32, and to mechanically secure electronic device 10 with reference to load card 60. Thus clamping device 100 includes upper and lower annular rings 102 and 104 disposed on opposite sides of load card 60 and of electronic device 10, with the load-card-to-device conductor assembly 82 disposed between the upper one of clamping device annular rings 102 and a surface of load card 60 and the major surface of electronic device 10. Lower annular ring 104 is preferably secured to customized load card 60.

Second clamping device 100 is mechanically aligned with reference to load card 60 and secured by means of a representative screw 106 passing through aperture 72 (FIG. 4). Sufficient clamping pressure is applied in second clamping device 100 to ensure reliable electrical contact via MOE conductor assembly 82. Preferably, second clamping device 100 has an opening 107 therein, allowing heating and cooling to be applied to the back of device 10.

To facilitate reliable and repeatable electrical contact of the gold MOE conductors to the various contact pads, it is preferable that the various contact pads present gold surfaces. Thus outer and inner contacts 66 and 68, respectively, of customized load card 60 are gold plated. Typically, contact pads 32 of HDI module 10 are initially aluminum, while it is preferable that a gold contact surface be provided prior to testing. Thus contact pads 32 may either be gold plated, or have a gold ball bond applied thereto.

As is apparent from FIG. 5, load card 60 has a thickness which fairly closely matches the thickness of load board 52. This facilitates contact between card 60 and board 52 on both sides. Typically, the thickness of electronic device 10 differs from that of load board 50 and load card 60. To accommodate the different thicknesses such that the major surface of electronic device 10 is coplanar with the surface of load card 60, lower annular ring 104 of clamping device 100 includes a step 108.

To facilitate alignment between customized load card 60 and electronic device 10, clamping device 100 includes a suitable alignment marker 110 secured to upper annular ring 82, for visually aligning with alignment marks 34 and 36 (FIGS. 1 and 3) on electronic device 10. The resulting alignment procedure is relatively simple, especially since load card aperture 54 closely matches electronic device 10 in size.

As noted above, test fixture 50 affords sufficient isolation of an electronic device under test from ATE load board 52 of the automatic test equipment to facilitate specialized test requirements, while at the same time maintaining the shortest possible electrical conductor lengths. For example, elastomeric connectors 80, 80' and 82 accommodate vibration testing of electronic device 10 while maintaining electrical continuity. To subject electronic device 10 to a force of 20 g's, for example, at a sufficiently high frequency, little actual motion is required. Likewise, heat and radiation can be applied to electronic device 10 while ATE load board 52 remains relatively isolated. Although test fixture 50 in the illustrated embodiments leaves electronic device 10 exposed for such special test requirements, as well as for pico-probing, in some situations it may be desirable to completely enclose electronic device 10 within a shielded enclosure. In this instance, clamping rings 102 and 104 may be provided with metal covers (not shown) which are screwed into place after electronic device 10 is aligned to test fixture 50.

From the foregoing, it will be appreciated that the present invention improves the entire test fixturing process by providing shorter signal paths, controlled impedance runs, shorter setup times, ease in alignment, and reduced fixturing cost by eliminating the need for a probe card or probe station, and by facilitating mechanical and other specialized test requirements. In addition, the electronic device under test is accessible for pico-probing. Moreover, design of customized load card 60 can be automated to rapidly produce a test fixture for a particular electronic device type.

While specific embodiments of invention have been illustrated and described herein, it is realized that numerous modifications and changes will occur to those skilled in the art. It is therefore to be understood that the appended claims are intended to cover all such modifications and changes as fall within the true spirit and scope of the invention

What is claimed is;

1. A test fixture for testing a generally planar electronic device having a major surface and a plurality of contact pads on the major surface, said test fixture comprising:
   a generally planar load board for interfacing to test equipment, said load board having two sides and an outer boundary, said load board including
      a load board aperture larger than the electronic device and located within the load board outer boundary, and
      a plurality of load board contacts disposed on at least one of said load board sides and surrounding said load board aperture;
   a generally planar printed circuit load card having two sides and an outer boundary sized to fit within said load board aperture in coplanar relationship, said load card including
      a load card aperture within the load card outer boundary sized and configured to match the electronic device such that the electronic device fits within said load card aperture in coplanar relationship,
      a plurality of load card outer contacts disposed on at least one of said load card sides located generally along said outer boundary and corresponding to said load board contacts,
      a plurality of load card inner contacts disposed on at least one of said load card sides surrounding said load card aperture and corresponding to the contact pads on the electronic device, and
      load card electrical conductors extending between selected ones of said load card outer contacts and said load card inner contacts;
   at least one load-board-to-load-card conductor assembly connected selected load board contacts to selected load card outer contacts; and
   at least one load-card-to-device conductor assembly for connecting selected load card inner contacts to corresponding electronic device contact pads.

2. A test fixture for testing a generally planar electronic device having a major surface and a plurality of contact pads on the major surface, said test fixture comprising:
   a generally planar load board for interfacing to test equipment, said load board having two sides, having a load board aperture larger than the electronic device and having a plurality of load board contacts disposed on at least one of said load board sides and surrounding said load board apertures;
   a generally planar printed circuit load card having two sides and an outer boundary sized to fit within said load board aperture in coplanar relationship, said load card including
      a load card aperture sized and configured to match the electronic device such that the electronic device fits within said load card aperture in coplanar relationship,
      a plurality of load card outer contacts disposed on at least one of said load card sides located generally along said outer boundary and corresponding to said board contacts,
      a plurality of load card inner contacts surrounding said load card aperture and corresponding to the contact pads on the electronic device, and
      load card electrical conductors extending between selected ones of said load card outer contacts and said load card inner contacts;
   at least one load-board-to-load-card conductor assembly connecting selected load board contacts to selected load card outer contacts, and at least one load-card-to-device conductor assembly for connecting selected load card inner contacts to corresponding electronic device contact pads, said conductor assemblies comprising metal-on-elastomer conductor assemblies;
   a first clamping device for securing said at least one load-board-to-load-card conductor assembly to said load board and to said load card to maintain electrical contact with said load board contacts and with said load card outer contacts, and to mechanically secure said load card with reference to said load board; and
   a second clamping device for securing said load-card-to-device conductor assembly to said load card and to the electronic device to maintain contact with said load card inner contacts and with the electronic device contact pads, and to mechanically secure the electronic device with reference to said load card.

3. A test fixture in accordance with claim 1, wherein said load board comprises a general purpose load board, and said load card is customized for the particular electronic device.

4. A test fixture in accordance with claim 3, wherein said load board aperture is of circular configuration.

5. A test fixture in accordance with claim 2, wherein said load card electrical conductors are configured to provide a predetermined design impedance.

6. A test fixture in accordance with claim 2, wherein said load card inner contacts correspond in pitch and number with the contact pads on the electronic device.

7. A test fixture in accordance with claim 2, wherein:
said load board contacts are spaced from said load board aperture;
said load board includes an electrical ground ring between said load board contacts and said load board aperture; and
said test fixture further comprises an insulative strip positioned between said electrical ground ring and said load-card-to-load-board conductor assembly.

8. A test fixture in accordance with claim 2, wherein said first clamping device comprises upper and lower annular rings disposed on opposite sides of said load board and on opposite sides of said load card, with said load-board-to-load-card conductor assembly disposed between one of said first clamping device annular rings and a surface of each of said load board and said load card.

9. A test fixture in accordance with claim 8, wherein:
said load board contacts are disposed on both sides of said load board;
said load card outer contacts are disposed on both sides of said load card; and
wherein said test fixture further comprises at least two load-board-to-load-card conductor assemblies respectively disposed on opposite sides of said load board and on opposite sides of said load card.

10. A test fixture in accordance with claim 2, wherein said second clamping device comprises upper and lower annular rings disposed on opposite sides of said load card and on opposite sides of the electronic device, with said load-card-to-device conductor assembly disposed between one of said second clamping device annular rings and each of a surface of said load card and the major surface of the electronic device.

11. A test fixture in accordance with claim 10, wherein:
said load card has a thickness different than the thickness of the electronic device; and
said second clamping device lower annular ring includes a step to accommodate said different thicknesses in a manner such that the major surface of the electronic device is coplanar with a surface of the load card.

12. A test fixture in accordance with claim 10, wherein
said second clamping device is mechanically aligned with reference to said load card; and
said second clamping device includes alignment markers for visual alignment with alignment marks on the electronic device.

13. A test fixture in accordance with claim 8, wherein said second clamping device comprises upper and lower annular rings disposed on opposite sides of said load card and on opposite sides of the electronic device, with said load-board-to-device conductor assembly disposed between one of said second clamping device annular rings and each of a surface of said load card and the major surface of the electronic device.

14. A test fixture in accordance with claim 13, wherein
said second clamping device is mechanically aligned with reference to said load card; and
said second clamping device includes alignment markers for visual alignment with alignment marks on the electronic device.

15. A test fixture in accordance with claim 9, wherein said second clamping device comprises upper and lower annular rings disposed on opposite sides of said load card and on opposite sides of the electronic device, with said load-board-to-device conductor assembly disposed between one of said second clamping device annular rings and each of a surface of said load card and the major surface of the electronic device.

16. A test fixture in accordance with claim 15, wherein: said load card has a thickness different than the thickness of the electronic device; and
said second clamping device lower annular ring includes a step to accommodate said different thicknesses in a manner such that the major surface of the electronic device is coplanar with a surface of the load card.

17. A test fixture in accordance with claim 15, wherein
said second clamping device is mechanically aligned with reference to said load card; and
said second clamping device includes alignment markers for visual alignment with alignment marks on the electronic device.

18. A test fixture in accordance with claim 14, wherein said load card electrical conductors are configured to provide a predetermined design impedance.

19. A test fixture in accordance with claim 18, wherein said load card inner contacts correspond in pitch and number to the contact pads on the electronic device.

20. A test fixture in accordance with claim 14, wherein said load card inner contacts correspond in pitch and number to the contact pads on the electronic device.

21. A test fixture in accordance with claim 14, wherein:
said load board contacts are spaced from said load board aperture;
said load board includes an electrical ground ring between said load board contacts and said load board aperture; and
said test fixture further comprises an insulative strip positioned between said electrical ground ring and said load-card-to-load-board conductor assembly.

* * * * *